(12) United States Patent
Mazzola et al.

(10) Patent No.: US 12,456,629 B2
(45) Date of Patent: Oct. 28, 2025

(54) METHOD OF PRODUCING SUBSTRATES FOR SEMICONDUCTOR DEVICE PACKAGES COMPRISING ANCHORING ENCAPSULATION TO DIE PAD

(71) Applicant: STMicroelectronics S.r.l., Agrate Brianza (IT)

(72) Inventors: Mauro Mazzola, Calvenzano (IT); Roberto Tiziani, Nerviano (IT)

(73) Assignee: STMicroelectronics S.r.l., Agrate Brianza (IT)

(*) Notice: Subject to any disclaimer, the term of this patent is extended or adjusted under 35 U.S.C. 154(b) by 467 days.

(21) Appl. No.: 17/873,967

(22) Filed: Jul. 26, 2022

(65) Prior Publication Data
US 2023/0031356 A1    Feb. 2, 2023

(30) Foreign Application Priority Data
Jul. 30, 2021  (IT) .................. 102021000020555

(51) Int. Cl.
*H01L 21/48*  (2006.01)
*H01L 23/00*  (2006.01)
*H01L 23/495*  (2006.01)

(52) U.S. Cl.
CPC ...... *H01L 21/4842* (2013.01); *H01L 21/4828* (2013.01); *H01L 23/49503* (2013.01);
(Continued)

(58) Field of Classification Search
CPC . H01L 21/4842; H01L 24/48; H01L 21/4828; H01L 23/49503; H01L 23/49558; H01L 23/49586; H01L 2224/48245
See application file for complete search history.

(56) References Cited

U.S. PATENT DOCUMENTS

2011/0115061 A1* 5/2011 Krishnan .......... H01L 23/49548
                                                    257/676
2012/0223429 A1* 9/2012 Khan .................... H01L 23/552
                                                    257/737
(Continued)

FOREIGN PATENT DOCUMENTS

CN          102064115 A      5/2011
CN          102132404 A      7/2011
(Continued)

OTHER PUBLICATIONS

IT Search Report and Written Opinion for priority application, IT 102021000020555, report dated Apr. 21, 2022, 9 pgs.
(Continued)

*Primary Examiner* — Norman D Richards
*Assistant Examiner* — Sean Ayers Winters
(74) *Attorney, Agent, or Firm* — Crowe & Dunlevy LLC

(57) ABSTRACT

A pre-molded leadframe includes a laminar structure having empty spaces therein and a first thickness with a die pad having opposed first and second die pad surfaces. Insulating pre-mold material is molded onto the laminar structure. The pre-mold material penetrates the empty spaces and provides a laminar pre-molded substrate having the first thickness with the first die pad surface left exposed. The die pad has a second thickness that is less than the first thickness. One or more pillar formations are provided protruding from the second die pad surface to a height equal to a difference between the first and second thicknesses. With the laminar structure clamped between surfaces of a mold, the first die pad surface and pillar formations abut against the mold surfaces. The die pad is thus effectively clamped between the clamping surfaces countering undesired flashing of the pre-mold material over the first die pad surface.

10 Claims, 4 Drawing Sheets

(52) U.S. Cl.
CPC .. *H01L 23/49558* (2013.01); *H01L 23/49586* (2013.01); *H01L 24/48* (2013.01); *H01L 2224/48245* (2013.01)

(56) References Cited

U.S. PATENT DOCUMENTS

| | | | | |
|---|---|---|---|---|
| 2012/0225522 | A1* | 9/2012 | Zhao | H01L 23/49816 438/107 |
| 2015/0380384 | A1* | 12/2015 | Williams | H01L 21/31058 438/112 |
| 2017/0005028 | A1* | 1/2017 | Talledo | H01L 23/49531 |
| 2017/0301617 | A1* | 10/2017 | Lin | H05K 1/0204 |

FOREIGN PATENT DOCUMENTS

| | | |
|---|---|---|
| CN | 218333789 U | 1/2023 |
| JP | 2003031753 A | 1/2003 |

OTHER PUBLICATIONS

CN First Office Action and Search Report for counterpart CN Appl. No. 202210911854.X, report dated Jul. 31, 2025, 7 pgs.

* cited by examiner

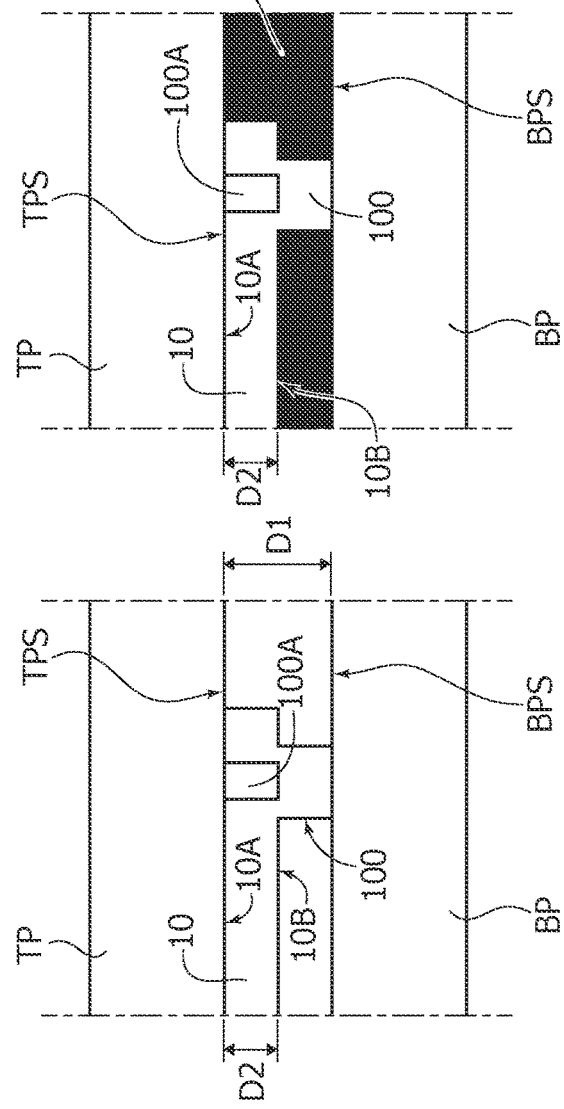

METHOD OF PRODUCING SUBSTRATES FOR SEMICONDUCTOR DEVICE PACKAGES COMPRISING ANCHORING ENCAPSULATION TO DIE PAD

PRIORITY CLAIM

This application claims the priority benefit of Italian Application for Patent No. 102021000020555, filed on Jul. 30, 2021, the content of which is hereby incorporated by reference in its entirety to the maximum extent allowable by law.

TECHNICAL FIELD

The description relates to semiconductor devices.

One or more embodiments can be applied to semiconductor power devices for use in the automotive sector, in consumer electronics, in computers and various other applications.

Power Supply Units (PSUs) for servers, laptop chargers, phone chargers and USB wall plugs are just a few examples of possible applications of embodiments.

BACKGROUND

Various semiconductor devices, such as power Quad-Flat No-leads (QFN) packages, benefit from the presence of an insulated die pad wherein the package leadframe is half-etched at the die pad area to create an insulating resin layer below the half-etched die pad.

Various issues may arise in producing such a pre-molded leadframe: for instance, leadframe clamping during pre-molding may not be completely effective in so far as, at the half-etched die pad, ensuring that the metal (copper) in the leadframe structure is just part (half) of its initial thickness.

As a result, the molding tool comes into contact with the front (top) surface of the die pad, which, however, is not supported at its back or bottom surface.

The die pad may thus become somehow floating in the molding tool and resin "flashes" (that is, resin smearing or leaking onto the die pad) may be produced at the front or top surface of the die pad that cannot be removed via de-flashing and/or polishing.

There is a need in the art to contribute in addressing the issues discussed in the foregoing.

SUMMARY

One or more embodiments can relate to a method.

One or more embodiments can relate to a corresponding substrate (leadframe).

One or more embodiments can relate to a corresponding semiconductor device.

One or more embodiments may provide a pre-molded QFN leadframe comprising sacrificial pillars to facilitate proper clamping of the half-etched die pad(s) intended to be embedded in pre-mold resin.

These sacrificial pillars can be removed during a subsequent half-etch step performed after final leadframe molding to form wettable-flanks for lead soldering, for instance.

Advantageously, one or more embodiments can provide increased anchoring of a second mold (encapsulation) to the pre-mold resin in the leadframe.

A pre-molded leadframe according to embodiments comprises one or more half-etched insulated die pads having support pillars extending towards the back or bottom side of the leadframe.

Advantageously, these support pillars comprise a hollow central portion on the front or top side. A final pre-molded leadframe can thus be produced (for use in manufacturing QFN packages, for instance) including cavities in the form of through holes.

A second mold (encapsulation) material can thus penetrate into these holes and come into contact with the pre-mold resin. Strong coupling (adhesion) between the pre-mold resin and the encapsulation can thus be achieved even in the presence of different types and/or amounts of fillers in the pre-mold resin and in the encapsulation.

BRIEF DESCRIPTION OF THE DRAWINGS

One or more embodiments will now be described, by way of example, with reference to the annexed figures, wherein:

FIGS. 5A to 5F are illustrative of steps in embodiments of the present description.

DETAILED DESCRIPTION

Figure 1A:
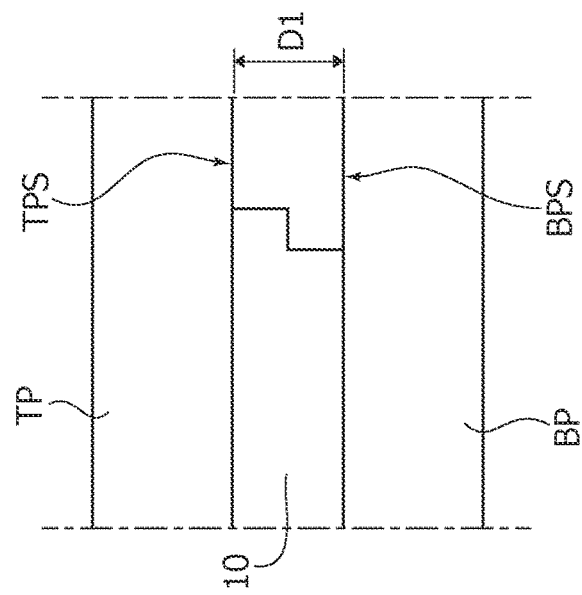
FIGS. 1A and 1B are exemplary of steps in conventional manufacturing of pre-molded substrates (leadframes)

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Semiconductor devices comprise one or more semiconductor chips or dice arranged (attached) on substrates such as leadframes.

Plastic packages are commonly used for semiconductor devices. Such packages may include a leadframe providing a base substrate comprising electrically conductive material (metal such as copper, for instance) sized and shaped to accommodate semiconductor chips or dice and providing pad connections (leads) for these chips or dice.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Leadframes are conventionally created using technologies such as a photo-etching technology. With this technology, metal material in the form of a foil or tape is etched on the top and bottom sides to create various pads and leads.

Quad-Flat No-lead (QFN) is a semiconductor device package family exhibiting a high growth rate in the area of semiconductor packaging.

QFN is a flexible and inexpensive package type with a wide range of possible applications and a pin count that may range between 2 pins (in the case of a diode, for instance) to 100 pins or more (in multiple-row arrangements for digital integrated circuits, for instance). It is noted that the designation "No-leads" applied to QFN packages refers to the fact that a QFN package typically has no leads protruding radially from the package, the leads or pins being in fact provided at the back or bottom surface of the package.

Leadframes for use as substrates for mounting QFN packages are advantageously provided in a "pre-molded" version wherein an insulating resin (an epoxy resin, for instance) fills the empty spaces between the die pads and leads.

Pre-molded leadframes are currently used including electrically insulating resin such as epoxy resin, for instance, molded onto a sculptured electrically conductive (e.g., metal) laminar structure using a flat molding tool, for instance.

Spaces left in the etched metal material (e.g., copper) are filled by pre-molding resin and the resulting leadframe has a total thickness which is the same thickness of the original etched leadframe.

After pre-molding (with the molded resin solidified, via heat or UV curing, for instance), de-flashing and smearing processes can be applied to provide clean top/bottom metal surfaces.

Wettable flanks can be provided, e.g., during a second etching step which can be applied to the pre-molded leadframe to generate dedicated etched areas.

Pre-molded leadframes offer various advantages in the process assembly flow (primarily in respect of wire bonding and molding).

Pre-molded leadframes are also advantageous in terms of design, for instance where plural die pads and fairly complex lead routing (for multi-chip applications, for instance) are features of interest.

A substrate in the form of the pre-molded leadframe can be manufactured using photo-etching technology starting from a sheet or strip of a metal material (copper, for instance) which is etched at the top and bottom sides to create the pads and die pads plus leads.

An insulating resin such as an epoxy resin is then molded (via a transfer technology, for instance). During molding of the resin, a mold tool is applied clamping the leadframe with the mold surfaces placed against the leadframe structure. A low-viscosity resin can be used to facilitate good flow and filling.

The pads (leads) and die pads are essentially exempt from mold flash (that is, mold resin smearing or leaking onto the pad surface) with moderate resin bleeding occurring locally. De-flashing and polishing processes can be applied after resin molding to obtain a clean metal surface (in view of Ag or NiPdAu finishing, for instance).

Figure 1B:
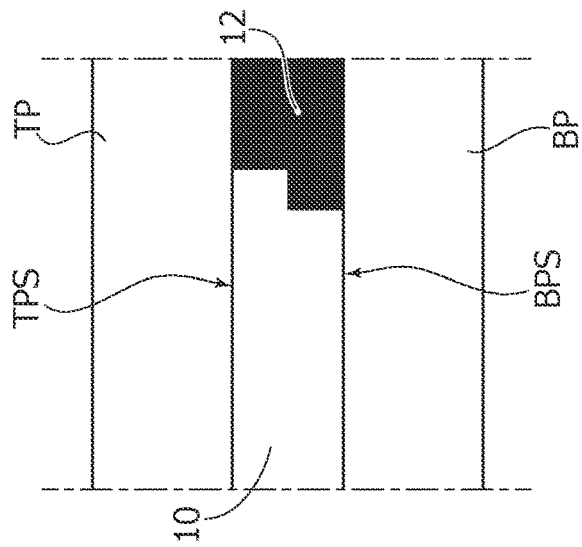
Figure 1C:
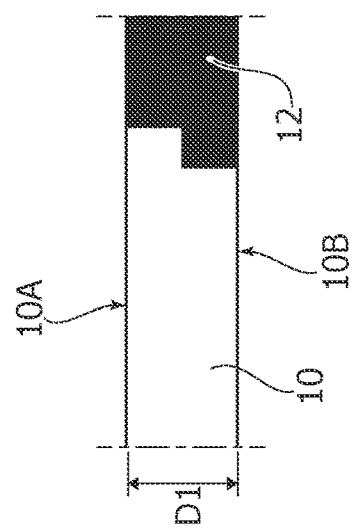
FIG. 1C is a schematic representation of a substrate obtained with the steps of FIGS. 1A and 1B.

The sequence of FIGS. 1A to 1C is schematically exemplary of a sequence of steps as discussed in the foregoing.

Specifically, in FIGS. 1A to 1C reference 10 denotes a die pad included in a sculptured, electrically conductive laminar structure of a leadframe (substrate). Such a sculptured structures has spaces therein that are originally empty and are then filled by pre-mold material 12 (resin such as an epoxy resin, for instance) molded onto the sculptured, electrically conductive laminar structure of a leadframe.

As illustrated in FIGS. 1A and 1B—these can be regarded essentially as partial cross-sectional views though the substrate (leadframe) 10—the pre-mold material is supplied in a flowable state while the laminar structure 10 is clamped between the planar clamping surfaces of pre-mold tool comprising a first (top) part TP and a second (bottom) part BP.

The planar clamping surfaces of the pre-mold tool, designated TPS and BPS, respectively, kept at a distance D1 equal to a final desired thickness of the leadframe (see FIG. 1C).

The pre-mold material 12 molded onto the laminar structure 10 that is clamped in the pre-mold tool TP, BP penetrates into the originally empty spaces in the sculptured metal structure of the leadframe.

A laminar pre-molded substrate (leadframe) is thus produced having the same thickness D1 of the laminar structure with a front (top) surface 10A of the die pad 10 left exposed (that is, uncovered) by the pre-mold material 12 (even after this is solidified, via UV or heat curing, for instance).

A leadframe structure as exemplified in FIGS. 1A to 1C facilitates good clamping between the planar clamping surfaces TPS, BPS so that no appreciable "flashing" of the pre-mold material 12 occurs at the surface 10A.

Some marginal resin bleeding over the surface 10A may take place, which can be removed via de-flashing and polishing steps, thus obtaining a clean metal surface 10A available for semiconductor chip mounting.

As visible in FIG. 1C, the sculptured metal structure of the leadframe (a die pad, such as 10, for instance) is exposed (that is left uncovered) by the pre-mold material 12, both at front or top surface 10A and at the back or bottom surface, designated 10B.

Various applications of pre-molded leadframes may benefit from the availability of an insulated die pad.

An insulated die pad is exposed (that is, left uncovered by the pre-mold material) only at the front or top surface 10A, while the back or bottom surface 10B is covered by pre-mold material 12. The die pad is thus electrically isolated at its back or bottom surface that is embedded in the molding material 12.

This situation is exemplified in FIGS. 2A to 2C, where parts or elements already discussed in connection with FIGS. 1A to 1C are indicated with the same reference symbols, so that the corresponding detailed description will not be repeated for brevity.

Figures 2A, 2B, 2C:
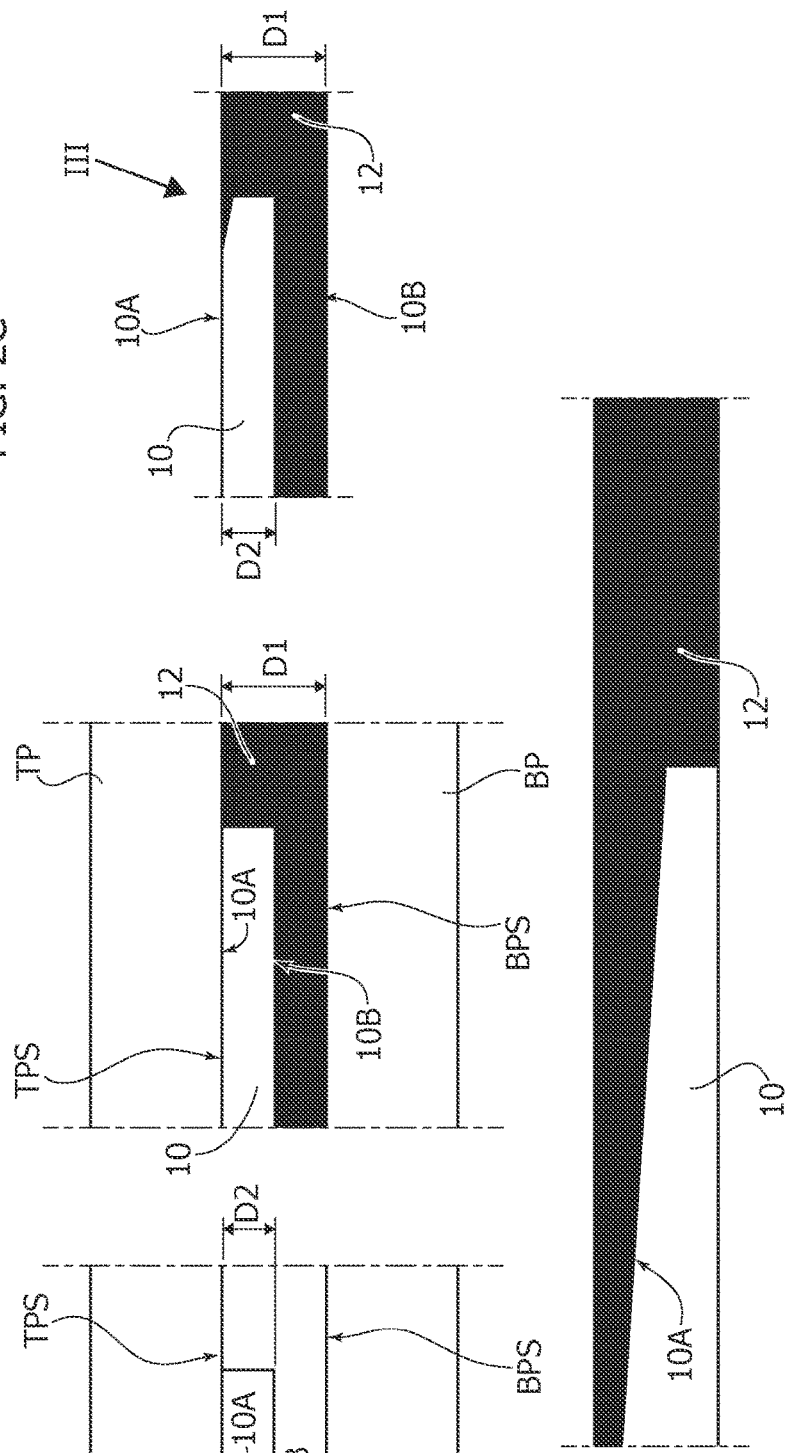
FIGS. 2A and 2B are exemplary of steps in conventional manufacturing of pre-molded substrates (leadframes) including a half-etched die pad.
FIG. 2C is a schematic representation of a substrate that can be obtained with the steps of FIGS. 2A and 2B.

In the case of an insulated pad arrangement as exemplified in FIGS. 2A to 2C, at the die pad 10 the sculptured leadframe (metal) structure exhibits a recessed portion at the back or bottom surface 10B.

At the die pad 10, the sculptured (metal) structure of the leadframe has a second thickness D2, which is less than the general thickness D1 of the pre-molded leadframe (see FIG. 2C for immediate reference).

For instance, in cases exemplified in FIGS. 2A to 2C, the die pad 10 may be a "half-etched" portion of the leadframe having a thickness D2 which is (at least approximately) half the thickness D1.

If the same process discussed previously in connection with FIGS. 1A and 1B is applied in producing a pre-molded leadframe having such a recessed portion/reduced thickness (e.g., a half-etched die pad 10) clamping between the clamping surfaces TPS and BPS of the clamping tool may not be completely effective.

In fact, in that case the die pad 10 will have: its front or top surface 10A (the surface intended to host one or more semiconductor chips mounted thereon) adequately abutting against the first planar mold surface TPS, and its back or bottom surface 10B (opposite the front or top surface 10A) arranged at a distance (given by the difference between D1 and D2) from the second planar mold surface BPS.

Consequently, the back or bottom surface 10B of the die pad 10 will not be supported by the bottom part BP of the molding tool leaving the die pad 10 floating and thus exposed to undesired displacement/bending.

Figure 3:
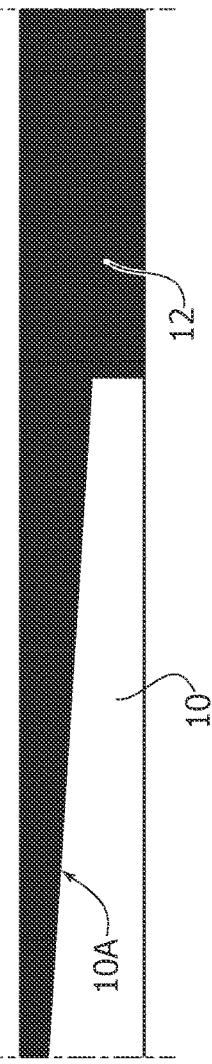
FIG. 3 is a view of a portion of FIG. 2C indicated by arrow III, reproduced on an enlarged scale.

As exemplified by the enlarged view of FIG. 3, this may result in undesired "flashing" of the pre-mold material 12 over the front or top surface 10A.

This is a defect likely to lead to rejection of the substrate as a defective product.

Such defect cannot be removed by standard de-flashing and/or polishing steps.

Figures 4A, 4B:
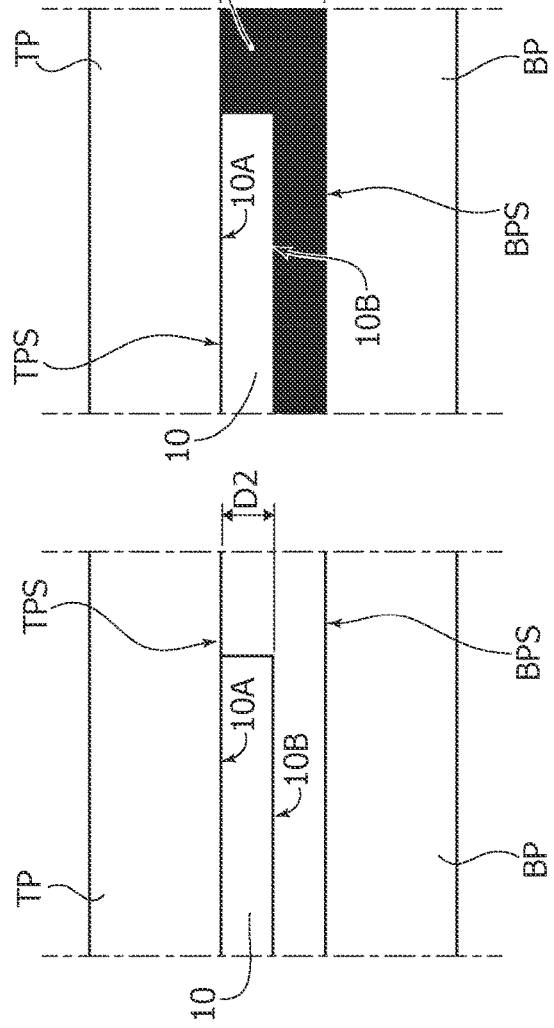
FIGS. 4A and 4B are exemplary of certain steps which may be attempted in order to dispense with defects as illustrated in FIG. 3.

In principle, such a defect could be attempted to be removed by some sort of grinding of the front or top surface of the pre-molded leadframe as indicated by G in FIG. 4B.

As illustrated in FIG. 4A, the front or top surface of the pre-molded leadframe comprises insulated die pads 10 plus pads or leads 14 (intended to provide the final contact pins of the device package) with the pre-mold material 12 filling the empty spaces in the sculptured metal structure (pads 10 and 14) of the leadframe.

Such possible grinding is found to be hardly feasible and effective.

In fact, the thickness of the pre-mold material 12 flashed onto the top or front surface 10A (see FIG. 3) may be in excess of 3 microns.

Grinding may thus undesirably reduce the thickness of the pre-molded leadframe. In turn this may result in undesirable leadframe distortion/delamination and surface damage.

These drawbacks cannot be set aside even resorting to measures such as providing shape-improving features such as zig-zag notches and so on.

FIGS. 5A to 5F are exemplary of steps wherein the drawbacks discussed in the foregoing are overcome with a die pad 10 again formed at a recessed portion of the leadframe having a thickness D2 which is less (a half, for instance) the overall thickness D1 of the leadframe.

As illustrated in FIGS. 5A to 5F, one or more (sacrificial) pillar formations 100 are provided protruding from the back or bottom surface 10B of the die pad 10.

The pillar formation 100 (only one is illustrated for simplicity) has a height equal to D1 minus D2, that is the difference between the first, total thickness D1 of the pre-molded leadframe and the second, smaller thickness D2 at the recessed portion, namely at the die pad 10.

As a result (see FIGS. 5A and 5B), when the leadframe metal structure of the leadframe is clamped between the clamping surfaces TPS, BPS, the front or top surface 10A will again abut against the surface TPS, and the distal end portion of the pillar formation 100 will likewise abut against the opposite clamp surface BPS. In that way adequate clamping of the sculptured metal structure of the leadframe (no die pad "floating") can be facilitated while the pre-mold material 12 is molded thereon as exemplified in FIG. 5B.

In that way, undesired flashing (smearing) of the pre-mold material 12 over the surface 10A can be effectively countered leading to a cleaner surface 10A of the die pad 10, exempt from appreciable flashing of pre-mold material thereover.

Advantageously, the pillar formation(s) 100 can be removed as illustrated in the sequence of FIGS. 5C and 5D.

For instance, this may occur during an etching step performed (in a manner known per se to those of skill in the art) with the aim of providing wettable flanks for soldering. The etching step can be carried out (using conventional technology) masking the bottom surface of the leadframe and performing (half) etching by removing metal material at those locations where wettable flanks are desired.

Such as step may involve applying a resist layer (shown and not referenced in FIG. 5C for simplicity) onto the front or top surface of the leadframe. The purpose of the resin layer is to protect the surface 10A against damage due to acid attack during removal of the pillar formations 100.

Such processing can be extended to the locations where the pillar formations 100 (as noted, one is illustrated for simplicity, but a plurality of those may be advantageously used) are provided.

As illustrated in the figures, a (blind) hole 100A can be advantageously provided in the die pad 10 at the location where the (each) pillar formation 100 is provided.

As visible in figures such as FIGS. 5A and 5B, the blind hole 100A is provided with an opening at the front of top surface 10A of the die pad and a blind, closed end at the back or bottom surface 10B where the pillar formation 100 is provided.

As visible in FIG. 5D, removing the pillar formation 100 causes the blind hole 100A to become a through hole extending between the opposed surfaces 10A and 10B of the die pad 10.

FIG. 5E is exemplary of a semiconductor chip or die 16 (one is illustrated for simplicity, but plural chips can be provided) mounted onto the front of top surface 10A of the die pad 10.

This may be via attach material (of any type known to those of skill in art, not visible in the figures).

After the possible formation of a wire bonding pattern 18 to provide electrical connections between the chip or chips 16 and electrically-conductive leads in the leadframe (see 14 in FIGS. 4A and 4B), encapsulation material 20 such as an epoxy resin, for instance, can be molded onto the resulting structure in order to complete the semiconductor device package.

As illustrated in FIG. 5F, the encapsulation material 20 (which is in a flowable state when molded) can penetrate into the through hole 100A thus advancing from the front or top surface 10A to the bottom or back surface 10B of the die pad 10 and onto the pre-mold material 12.

As a result of the pre-mold material 12 and the encapsulation material 20 being solidified (via UV or heat curing, for instance), this arrangement provides a strong coupling of the encapsulation 20 as generally desirable both to the die pad 10 and to the pre-mold material 12, also when the resin materials 12 and 20 have different filler contents (types and amounts of fillers).

It is noted that the blind hole (and subsequently through) hole 100A will have a cross-sectional area at least marginally smaller than the homologous cross-sectional area of the pillar formation 100. As a consequence, the pillar formation 100, once removed, will leave an empty space in the material 12 of a larger cross-sectional area of the hole 100A.

Consequently, the encapsulation material 20 penetrating into the hole 100A and on to the pre-mold material 12 will end up by exhibiting an inverted-T (or inverted-mushroom shape) with a distal portion larger than the stem portion extending through the hole 100A.

As a result, the encapsulation 20, once solidified—like the mold material 12—will provide a robust form coupling to anchor the materials 12 and 20 with the die pad 10 sandwiched therebetween.

Figure 6B:
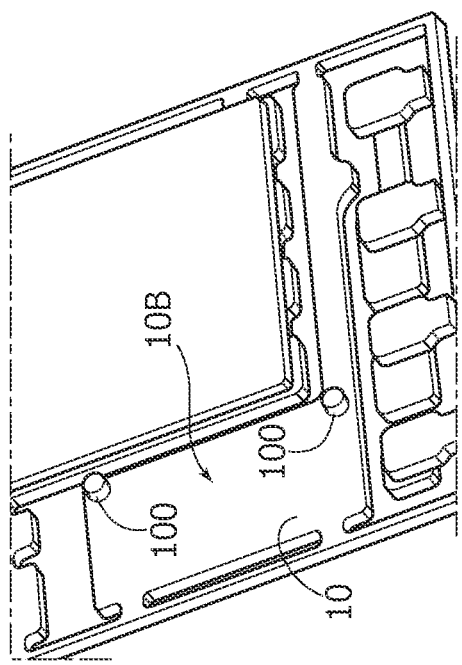
FIGS. 6A and 6B are perspective views from opposed viewpoints of a substrate structure according to embodiments of the present description.
Figure 6A:
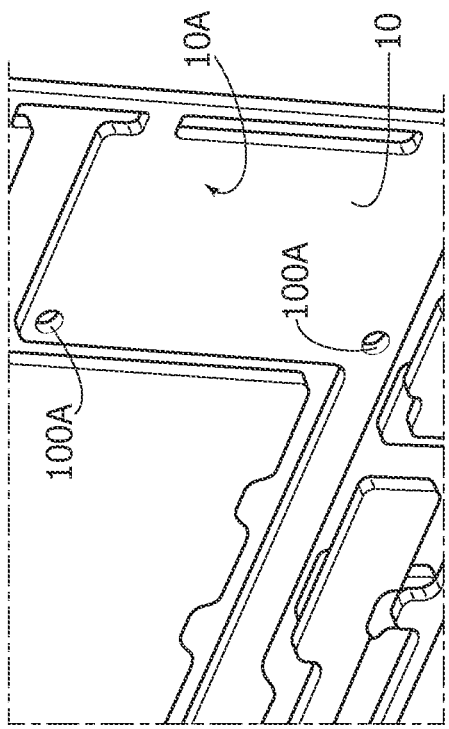

FIGS. 6A and 6B are illustrative of possible implementations of a sculptured, electrically conductive metal structure of a pre-mold leadframe prior to a pre-mold material such as 12 being molded onto that structure.

Pillar formations 100 are visible provided at the back or bottom surface 10B of a die pad 10, with blind holes 100A provided at the front or top surface 10A at locations corresponding to the locations where the pillar formations 100 are provided.

Examples as described herein provide temporary pillar structures such as 100 connected to die pads 10 for which insulation is desirable.

The pillar formations 100 create a (localized) portion of an otherwise half-etched die pad having a thickness D1 of metal material that facilitates adequate clamping of the leadframe between the clamping surfaces TPS, BPS of the clamping tool.

In that way, with the laminar structure 10, 14 clamped between the planar clamping surfaces TPS, BPS of the pre-mold tool TP, BP kept at a distance equal to said first thickness D1, the first die pad surface 10A is kept firmly abutting against the first planar clamping surface TPS of the pre-mold tool TP, BP.

Possible displacement of a "floating" die pad 10 as in the case of FIGS. 2A and 2B, with ensuing flashing of the pre-mold material 12 over the surface 10A as exemplified in FIG. 3 is thus effectively countered.

A "clean" die pad surface 10A is thus left exposed by the pre-mold material 12, with such die pad surface 10A exempt from pre-mold material 12 flashed thereon.

At the same time the pillar formation(s) 100 protruding from the second die pad surface 10B (of a height equal to the difference between the thickness D1 and the thickness D2) will comprise a distal end portion left exposed by the pre-mold material 12.

Such pillar formations 100 can be removed, via etching, for instance, which may take place during a processing step intended to form wettable flanks for soldering.

A resulting semiconductor device will thus comprise a sculptured electrically conductive laminar structure 10, 14 having spaces therein and a first thickness D1.

A structure as illustrated includes one or more die pads 10 having a mutually opposed first 10A and second 10B die pad surfaces with a second thickness D2 therebetween which is less than the first thickness (D1) and insulating pre-mold material 12 molded onto the laminar structure 10, 14 penetrating into the spaces in the base metal (e.g. copper) structure to provides a laminar pre-molded substrate (leadframe) having the (first) thickness D1 and including the first die pad surface 10A left exposed by the pre-mold material 12.

A semiconductor device as per the examples herein will also include one or more semiconductor chips or dice 16 mounted on the first die pad surface 10A, with: the first die pad surface 10A exempt from pre-mold material 12 (undesirably) flashed thereon, and the second die pad surface 10B covered by the insulating pre-mold material 12 to provide (desirably) insulation of the die pad 10.

As noted, pillar formations such as 100 are advantageously formed with a hollow structure which facilitates encapsulation flow during final assembly of the package to complete isolation of the die pad.

An insulating encapsulation 20 can in fact be molded onto the laminar pre-molded substrate (leadframe 10, 12, 14) and one or more semiconductor chips 16 mounted on the first die pad surface 10A.

As a result of removal of the pillar formations 100 the die pad 10 will have through holes 100A therein between the first die pad surface 10A and the second die pad surface 10B.

The encapsulation 20 will thus penetrate into these through holes 100A and contact the pre-mold material 12 in the laminar pre-molded substrate thus providing firm anchoring between the materials 12 and 20 with the leadframe sandwiched therebetween.

Without prejudice to the underlying principles, the details and embodiments may vary, even significantly, with respect to what has been described in the foregoing, by way of example only, without departing from the extent of protection.

The claims are an integral part of the technical teaching provided herein in respect of the embodiments.

The extent of protection is determined by the annexed claims.

The invention claimed is:

1. A method, comprising:
providing a sculptured electrically conductive laminar structure having spaces therein, wherein the sculptured electrically conductive laminar structure has a first thickness and includes at least one die pad having a first die pad surface configured to mount a semiconductor chip mounted and a second die pad surface opposite the first die pad surface, wherein the at least one die pad has a second thickness between the first die pad surface and the second die pad surface, the second thickness being less than the first thickness;
providing said sculptured electrically conductive laminar structure with at least one pillar formation protruding from the second die pad surface, wherein each pillar formation has a height equal to a difference between said first thickness and said second thickness;
clamping the sculptured electrically conductive laminar structure between a first planar clamping surface and a second planar clamping surface of a pre-mold tool with the first planar clamping surface of the pre-mold tool abutting against the first die pad surface and the second planar clamping surface of the pre-mold tool abutting against a distal end portion of each pillar formation, wherein a distance between the first planar clamping surface and the second planar clamping surface is substantially equal to said first thickness;
molding insulating pre-mold material to penetrate into said spaces of the sculptured electrically conductive laminar structure clamped between the first and second planar clamping surfaces of the pre-mold tool and provide a laminar pre-molded substrate having said first thickness and including said first die pad surface and distal end portion of each pillar formation left exposed by the pre-mold material; and then removing said at least one pillar formation protruding from the second die pad surface.

2. The method of claim 1, further comprising, before molding, providing in the first die pad surface a blind hole in register with each pillar formation protruding from the second die pad surface, wherein removing said at least one pillar formation causes said blind hole to become a through hole between the first and second die pad surfaces.

3. The method of claim 2, further comprising:

mounting a semiconductor chip on said first die pad surface left exposed by the pre-mold material in the laminar pre-molded substrate; and subsequent to removing said at least one pillar formation, molding an insulating encapsulation onto the laminar pre-molded substrate having the semiconductor chip mounted on said first die pad surface, wherein said insulating encapsulation penetrates into said through hole and contacts the pre-mold material in the laminar pre-molded substrate.

4. The method of claim 1, wherein the second thickness between the first die pad surface and the second die pad surface is approximately half said first thickness.

5. The method of claim 1, wherein providing said sculptured electrically conductive laminar structure having spaces therein comprises etching a laminar metal material.

6. A method, comprising:

sculpturing a back side of a die pad having a first thickness between a front side of the die pad and the back side to include at least one pillar formation protruding from a bottom die pad surface, wherein the die pad has a second thickness between the front side and the bottom die pad surface, the second thickness being less than the first thickness;

clamping the die pad between a first planar clamping surface and a second planar clamping surface of a pre-mold tool with the first planar clamping surface of the pre-mold tool abutting against the front side of the die pad and the second planar clamping surface of the pre-mold tool abutting against the back side of the die pad and against a distal end portion of the at least one pillar formation, wherein a distance between the first planar clamping surface and the second planar clamping surface is substantially equal to said first thickness;

molding insulating pre-mold material to the die pad clamped between the first and second planar clamping surfaces of the pre-mold tool to provide a pre-molded die pad having said first thickness and including said first die pad surface and distal end portion left exposed by the pre-mold material; and then removing said at least one pillar formation protruding from the second die pad surface.

7. The method of claim 6, further comprising sculpturing the front surface of the die pad to include at least one blind hole in register with the at least one pillar formation.

8. The method of claim 7, wherein removing said at least one pillar formation comprises forming an opening at the location of the at least one pillar formation, said opening having a depth that reaches the at least one blind hole to produce a through hole formed by the at least one blind hole and the opening at the location of the at least one pillar formation.

9. The method of claim 8, further comprising mounting a semiconductor chip to the front side of the die pad.

10. The method of claim 9, further comprising, subsequent to removing said at least one pillar formation, molding an insulating encapsulation onto the mounted semiconductor chip, wherein said insulating encapsulation penetrates into said through hole.

* * * * *